United States Patent

Uemura

[11] Patent Number: 5,977,619
[45] Date of Patent: Nov. 2, 1999

[54] HORIZONTAL PACKAGE HAVING DIE SUPPORTS LEADS FORMED ALONG LEAD COLUMN

[75] Inventor: Minoru Uemura, Tokyo, Japan

[73] Assignee: NEC Corporation, Tokyo, Japan

[21] Appl. No.: 09/058,772

[22] Filed: Apr. 13, 1998

[30] Foreign Application Priority Data

Apr. 11, 1997 [JP] Japan .................................. 9-093767

[51] Int. Cl.⁶ .................................................. H01L 23/495
[52] U.S. Cl. ........................................ 257/676; 257/666
[58] Field of Search ..................................... 257/676, 666

[56] References Cited

U.S. PATENT DOCUMENTS

| | | | |
|---|---|---|---|
| 5,065,224 | 11/1991 | Fraser et al. ............................. | 257/666 |
| 5,150,194 | 9/1992 | Brooks et al. ........................... | 257/676 |
| 5,455,200 | 10/1995 | Bigler et al. ............................ | 257/676 |
| 5,570,046 | 10/1996 | Sharpe-Geisler ........................ | 257/666 |
| 5,592,020 | 1/1997 | Nakao et al. ............................ | 257/666 |
| 5,907,184 | 5/1999 | Corisis et al. ........................... | 257/666 |

FOREIGN PATENT DOCUMENTS

| | | | |
|---|---|---|---|
| 63-47351 | 9/1988 | Japan . | |
| 6-196618 | 7/1994 | Japan .................................... | 257/676 |

*Primary Examiner*—David B. Hardy
*Attorney, Agent, or Firm*—Sughrue, Mion, Zinn Macpeak & Seas, PLLC

[57] ABSTRACT

Supporting leads extend from one side portion of a package to another side portion thereof and are arranged on both sides of an island such that both ends of the island are supported. An electrode for a fixing potential of a semiconductor chip is connected to these supporting leads by a bonding wire. One end of these supporting lead is located outside a column of an outer lead portion as the same structure as the outer lead portion. Thus, while a structure for commonly using each of the supporting leads as a lead for a fixing potential is adopted, a thermal distribution of the semiconductor chip can be uniformed and no island is inclined at a resin seal time.

5 Claims, 4 Drawing Sheets

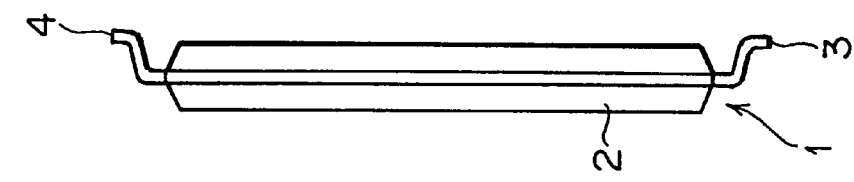
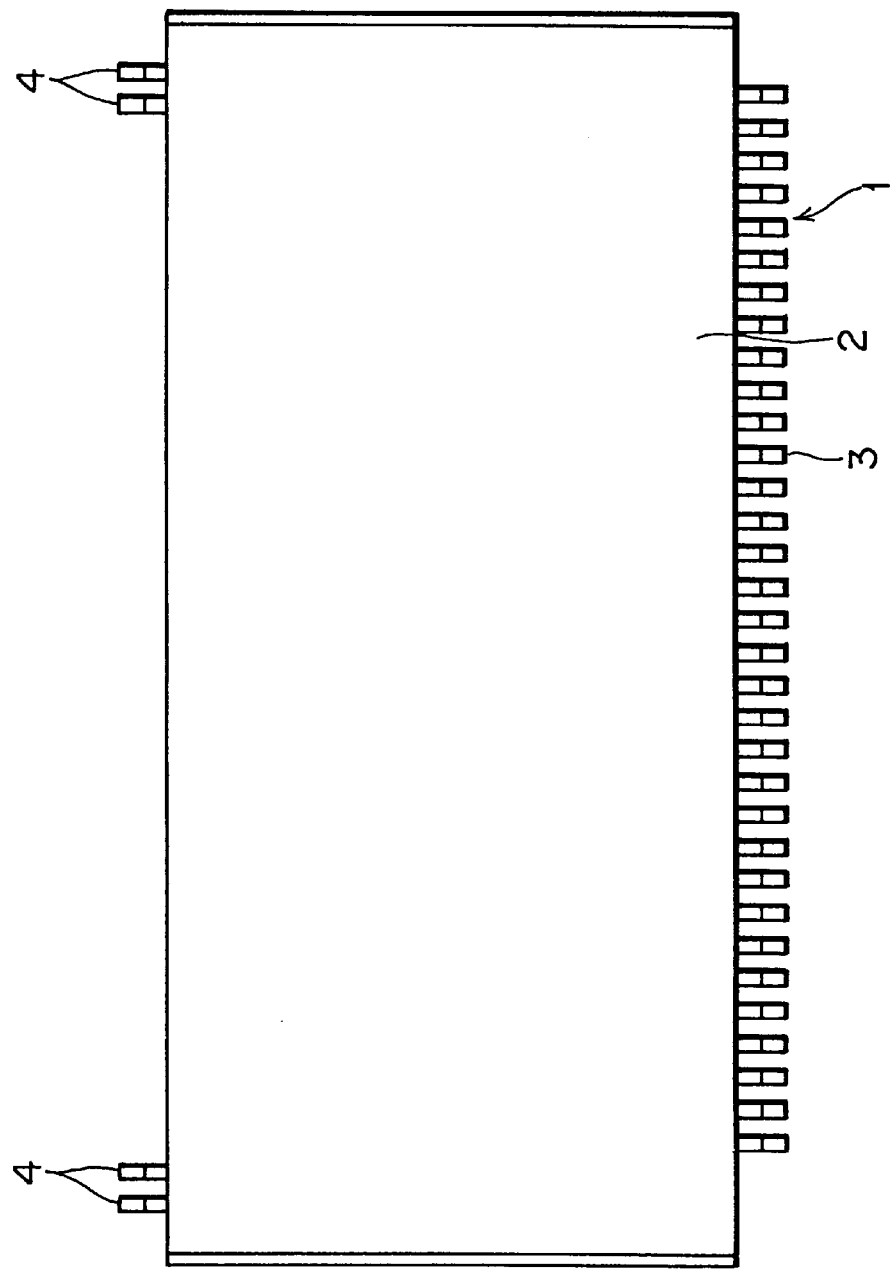
FIG. 3B (PRIOR ART)
FIG. 3A (PRIOR ART)

HORIZONTAL PACKAGE HAVING DIE SUPPORTS LEADS FORMED ALONG LEAD COLUMN

BACKGROUND OF THE INVENTION

1. Field of the Invention

The present invention relates to a semiconductor device having a structure in which signal pins are concentrated on one side of a package such as a Rambus DRAM (Dynamic Random Access Memory), etc.

2. Prior Art

A conventional semiconductor device of this kind will next be explained with reference to FIGS. 3A and 3B and 4.

FIGS. 3A and 3B are a view showing an SHP (Surface Horizontal Package) type Rambus DRAM. FIG. 3A is a side view of this SHP type Rambus DRAM and FIG. 3B is a plan view of this SHP type Rambus DRAM. FIG. 4 is a plan view showing a lead frame for the conventional SHP type DRAM and shows a state of the lead frame after a semiconductor chip is mounted to the lead frame and wire bonding is performed. In FIG. 4, only a forming portion of one semiconductor device is enlarged and drawn.

In FIGS. 3A and 3B, reference numeral 1 designates the conventional SHP type Rambus DRAM (hereinafter, simply called a semiconductor device). Reference numeral 2 designates seal resin for forming a package of this semiconductor device 1. In this semiconductor device 1, many pins 3 for external connection are projected in one side portion of the seal resin 2 and four pins 4 for support are projected in another side portion of the seal resin 2. The semiconductor device 1 is mounted onto the surface of an unillustrated printed wiring board by these pins. Only the above pins 3 for external connection among these pins are connected to a semiconductor chip described later within the seal resin 2.

A lead frame used to manufacture this semiconductor device 1 is formed as shown in FIG. 4. In FIG. 4, this lead frame is designated by reference numeral 5. This lead frame 5 is formed by two lead frame portions 6, 6 extending in a vertical direction in FIG. 4, tie bars 7, 8 for connecting these lead frame portions 6 to each other, an island 11 connected to these tie bars 7, 8 through supporting leads 9, 10, and many leads 12 for external connection extending from the tie bar 8 located on a lower side in FIG. 4 among the above tie bars 7, 8 to a side of the other tie bar 7. The semiconductor chip 13 is mounted to the above island 11. An electrode for a signal and an unillustrated electrode for a fixing potential (ground) on this semiconductor chip 13 are connected to an inner lead portion 12a of the above lead 12 for external connection by a bonding wire 14.

The above supporting lead 9 supports a center of the island 11 on its upper side. The above supporting lead 10 supports two island portions on both lower sides of the island 11. The supporting lead 9 and the supporting lead 10 are folded in their intermediate portions such that the island 11 is one-sided below the lead frame portion 6 and the tie bars 7, 8. These folding portions are designated by reference numerals 9a, 10a.

A basic end portion 10b of the above supporting lead 10 on a side of the tie bar 8, and an outer lead portion 12b of the lead 12 for external connection connected to the tie bar 8 form the pins 3 for external connection shown in FIG. 3. The pins 4 for support are formed integrally with the tie bar 7 and are not connected to the semiconductor chip 13.

When the semiconductor device 1 is manufactured by using this lead frame 5, the semiconductor chip 13 is mounted to the island 11 and wire bonding is performed as shown in FIG. 4. Thereafter, the seal resin 2 is first molded. This resin is sealed by mounting the lead frame 5 to a mold die of an unillustrated transfer molding machine and injecting the seal resin in a melting state into a cavity of this mold die and solidifying this seal resin. In this lead frame 5, a range sealed by the seal resin 2 is shown by a two-dotted chain line in FIG. 4.

After the resin seal process is terminated, a forming portion of the semiconductor device is separated from this lead frame 5. At this time, the outer lead portion 12b of the lead 12 for external connection, the basic end portion 10b of the supporting lead 10 and the pins 4 for support are set to be left on a side of the seal resin 2. Thereafter, the pins 3 for external connection and the pins 4 for support projected from the seal resin 2 onto its side are folded as shown in FIG. 3(a) so that a manufacture process of this semiconductor device 1 is terminated.

However, in this semiconductor device 1, there is a limit in an increase in an operating speed of the semiconductor chip 13. This is because no heat radiating property can be improved and no parasitic impedance of a signal system can be reduced.

The semiconductor device 1 of this kind, DRAMs, for example, Rambus, synchronous etc. attain an operating speed of several hundred MHz and a power assumption of several watts. Therefore, the semiconductor chip 13 is raised in temperature at an operating time of the semiconductor device. The semiconductor chip 13 of the semiconductor device 1 manufactured by using the lead frame shown in FIG. 4 is cooled by conducting lead through the supporting lead 10 and the seal resin 2 and externally radiating this heat. At this time, no electric current flows through the supporting lead 10. Accordingly, when the supporting lead 10 is soldered to a printed wiring board, the supporting lead 10 is not necessarily connected to a wiring pattern widely extending on the printed wiring board. Therefore, a ratio of heat conducted onto a side of the printed wiring board through the supporting lead 10 is extremely small so that the heat of this semiconductor device 1 is mainly radiated into the atmosphere through the seal resin 2. Namely, the heat must be radiated through the seal resin 2 having a low coefficient of thermal conductivity in comparison with a metal. Accordingly, no heat radiating property can be improved so that no semiconductor chip 13 can be operated at high speed.

Further, the lead 12 for external connection and the supporting lead 10 are connected to one tie bar 8 and the inner lead portion 12a must be arranged in a space except for the supporting lead 10 so that a degree of freedom is low in the designs of a shape and a size of the inner lead portion 12a. Namely, no signal system connected to an electrode of the semiconductor chip 13 can be formed in a mode for reducing parasitic impedance so that no operating speed of the semiconductor chip 13 can be increased.

To solve such disadvantages, for example, as disclosed in Japanese Patent Application Laid-Open No. 63-47351, it is considered that an electrode for a fixing potential of the semiconductor chip is connected to the supporting lead by a bonding wire and the function of a lead for a fixing potential is provided to this supporting lead. Namely, the supporting lead 10 is connected to a wiring pattern for a fixing potential of the printed wiring board by connecting the electrode for a fixing potential of the semiconductor chip 13 to the supporting lead 10 shown in FIG. 4 by the bonding wire. Accordingly, heat transmitted from the semiconductor chip 13 to the island 11 is radiated in a wide range of the printed wiring board so that the heat radiating property can be improved. Further, the lead 12 for external connection formed for the fixing potential and the supporting lead 10 can be constructed by one lead so that a space for extending the inner lead portion 12a is widened. Accordingly, a degree of freedom on design of the inner lead portion 12a is increased and the inner lead portion 12a can be formed such that parasitic impedance is reduced.

However, in the lead frame 5 shown in FIG. 4, two supporting leads 10 are connected to one side (one side on which the outer lead portion 12b is arranged in parallel) of the island 11. Accordingly, when the above structure is adopted, the heat of the semiconductor chip 13 is radiated from one side of the island 11 so that the heat radiating property is improved, but a thermal distribution of the operated semiconductor chip 13 is one-sided. It is considered that the number of supporting leads 10 is increased to uniform this thermal distribution. However, to do this, the island 11 must be constructed such that this island 11 can be supported by the supporting leads in well balance. This is because it is necessary that no island 11 is inclined by the seal resin when the seal resin in a melting state is injected into the mold die in the resin seal process. When the island 11 is inclined, there is a case in which the bonding wire 14 is pulled and disconnected and an upper side corner portion of the semiconductor chip 13 is exposed to a surface of the seal resin 2.

SUMMARY OF THE INVENTION

To solve such disadvantages, an object of the present invention is to provide a semiconductor device in which the thermal distribution of a semiconductor chip is uniformed and no island is inclined at a resin seal time while a structure for commonly using a supporting lead as a lead for a fixing potential is adopted.

According to the present invention, there is provided a semiconductor device comprises: a semiconductor chip having fixing potential electrodes; and a lead frame for supporting said semiconductor chip. Said lead frame has an island for mounting said semiconductor chip; leads for external connection of said semiconductor chip, having inner lead portions connected to said semiconductor chip through bonding wires and outer lead portions connected to said inner lead portions, respectively, and provided at one side portion of said island so as to be connected each other and arranged at a column parallel to said on side of said island; supporting leads for supporting said island at both sides of said island, said supporting leads being arranged on both sides of said island such that one end of each of said supporting leads supports said outer lead portions at both ends of said column of said outer lead portions; and bonding wires for connecting said fixing potential electrodes of said semiconductor chip and supporting leads.

In accordance with the present invention, each of the supporting leads can also function as a lead for a fixing potential so that the number of leads each used as a lead for only a fixing potential can be reduced and a space for forming a lead for external connection can be widened. Since the supporting leads are formed on both the sides of the island, the above space is not divided by these supporting leads.

Heat of the semiconductor chip is conducted to a wiring pattern for a fixing potential on a printed wiring board from both ends of the island through the supporting leads, and is radiated in a wide range of the printed wiring board. Further, since both the sides of the island are supported by the supporting leads, the island can be supported by the supporting leads in well balance. Further, since the supporting leads extend from one side portion of the package to another side portion thereof, both ends of the supporting leads can be supported.

In a semiconductor device in another invention, in the above-mentioned semiconductor device, a first sub supporting lead is arranged within a lead group constructed by the inner lead portions of leads for external connection such that one end of the first sub supporting lead is connected to the island and the other end of the first sub supporting lead has the same structure as said outer lead portion. An electrode for a fixing potential of the semiconductor chip is connected to this first sub supporting lead by the bonding wire and a second sub supporting lead is arranged on a side opposed to this first sub supporting lead through a semiconductor chip mounting portion.

In accordance with the present invention, the number of heat radiating points can be increased by the first sub supporting lead also used as a lead for a fixing potential. No support of the island is unbalanced since the second sub supporting lead is arranged on an opposite side even when the first sub supporting lead is added in this way.

In the semiconductor device in the present invention, since each of the supporting leads can also function as a lead for a fixing potential, the number of leads each used as a lead for only a fixing potential can be reduced and a space for forming each lead for external connection can be widened. In particular, since the supporting leads are formed on both the sides of the island, the above space is not divided by these supporting leads. Therefore, the lead for external connection can be formed such that parasitic impedance is reduced.

Heat of the semiconductor chip is conducted from both the ends of the island to the wiring pattern for a fixing potential on the printed wiring board through the supporting leads and is radiated in a wide range of the printed wiring board. Therefore, heat is radiated from both sides of the operated semiconductor chip so that a thermal distribution is approximately uniformed.

Further, since both the sides of the island are supported by the supporting leads, the island can be supported by the supporting leads in well balance. Furthermore, both the ends of the supporting leads can be supported since the supporting leads extend from one side portion of the package to another side portion thereof. Therefore, since the supporting leads can be also strongly supported, the island can be strongly supported in well balance and is not inclined by seal resin at a resin seal time.

Accordingly, while a structure for commonly using each of the supporting leads as a lead for a fixing potential is adopted, it is possible to provide a semiconductor device in which a thermal distribution of the semiconductor chip can be uniformed and no island is inclined at the resin seal time.

In accordance with the semiconductor device in another invention, the number of heat radiating points can be increased by the first sub supporting lead also used as a lead for a fixing potential. Accordingly, a heat radiating property can be further improved in comparison with the above semiconductor device in the present invention. Further, since the second sub supporting lead is arranged on a side opposed to the first sub supporting lead through the semiconductor chip mounting portion, no support of the island is unbalanced and the number of supporting points is increased in comparison with the above semiconductor device in the present invention so that the island can be further strongly supported.

BRIEF DESCRIPTION OF THE DRAWINGS

FIG. 3A and 3B are view showing a conventional SHP type Rambus DRAM.

DESCRIPTION OF THE PREFERRED EMBODIMENT

One embodiment of a semiconductor device in the present invention will next be described in detail with reference to FIGS. 1 and 2.

Figure 1:
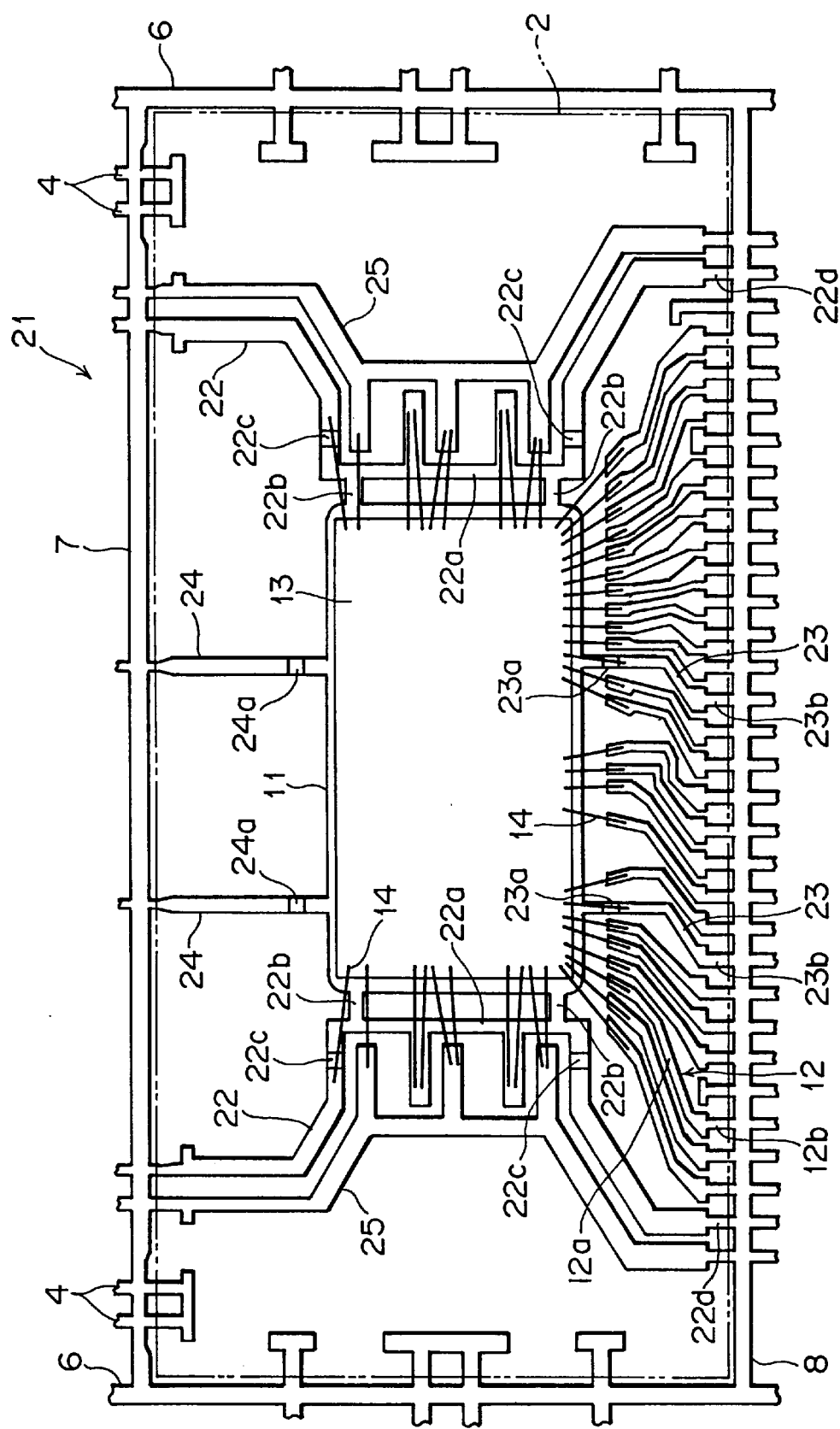
FIG. 1 is a plan view of a lead frame used to manufacture a semiconductor device in the present invention.
Figure 4:
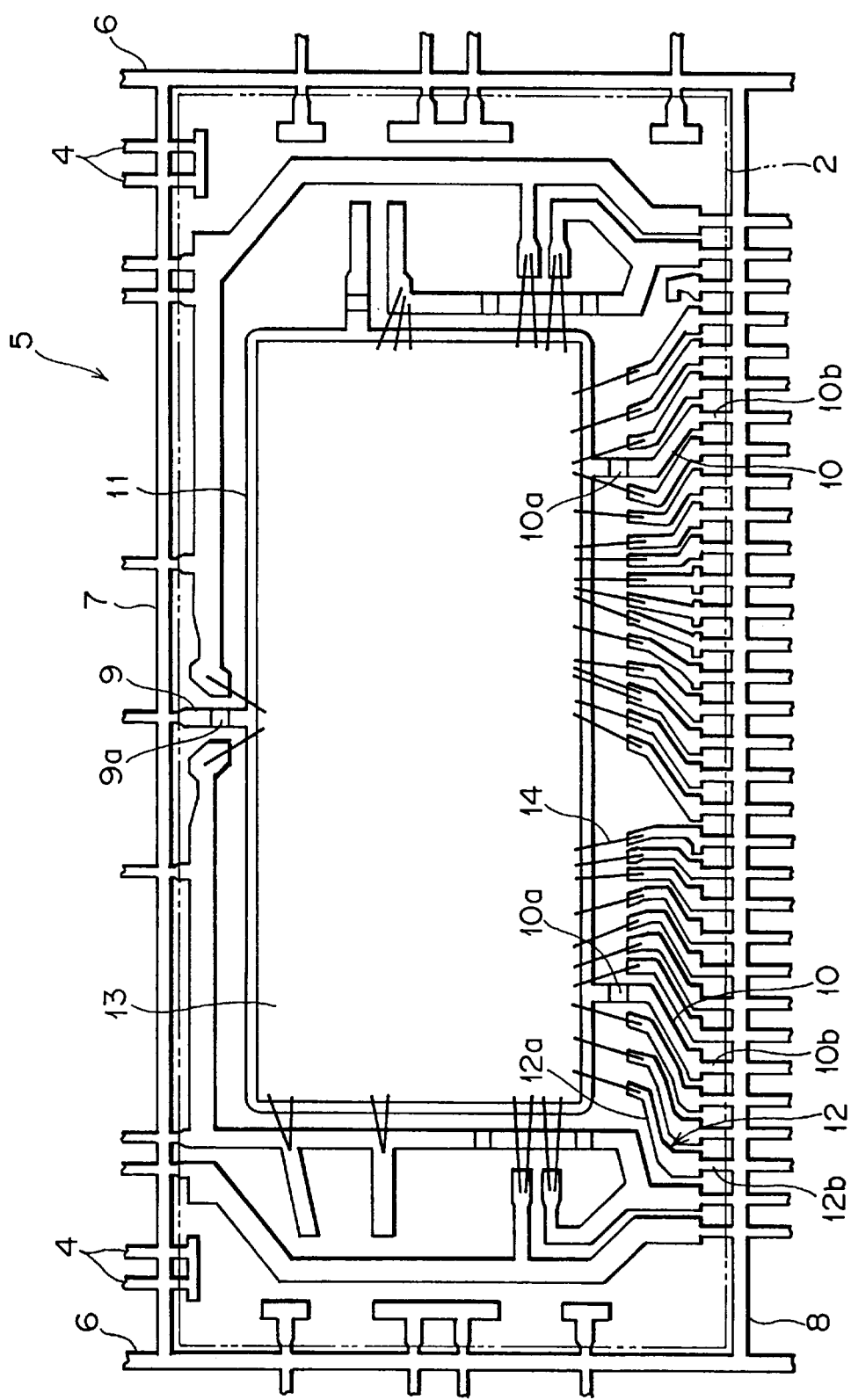
FIG. 4 is a plan view showing a lead frame for the conventional SHP type DRAM.

FIG. 1 is a plan view of a lead frame used to manufacture the semiconductor device in the present invention and enlarged and drawn only a forming portion of one semiconductor device. FIG. 2 is a perspective view showing the structure of a connection portion of a supporting lead and an island. In these figures, members equal or equivalent to those explained in the above FIGS. 3 and 4 are designated by the same reference numerals and a detailed explanation thereof is omitted in the following description.

Figure 2:
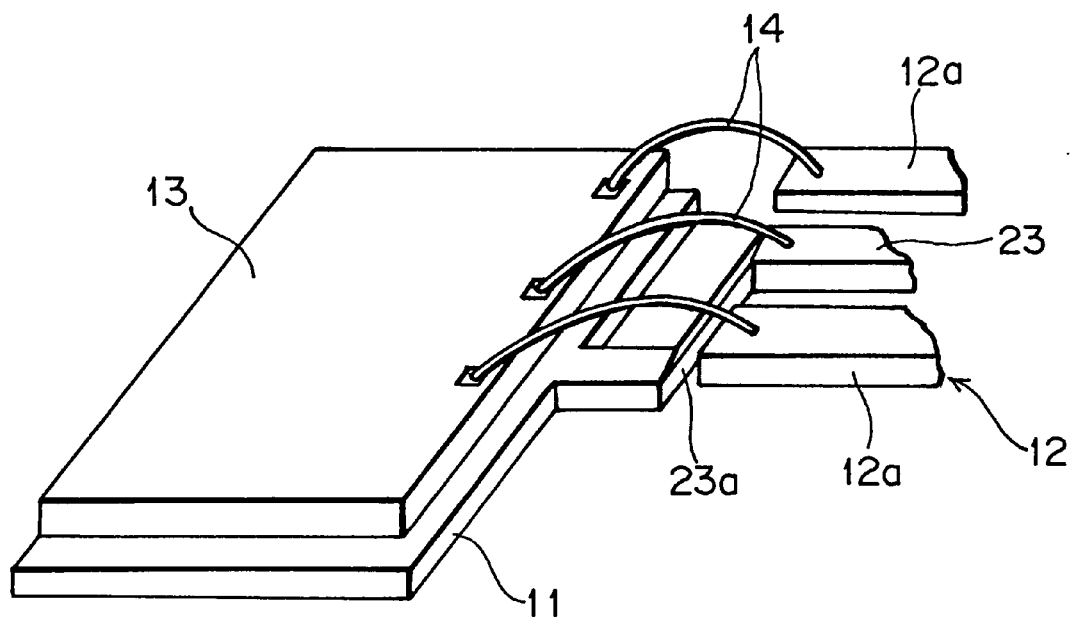
FIG. 2 is a perspective view showing the structure of a connection portion of a supporting lead and an island.

A lead frame is designated by reference numeral 21 in FIGS. 1 and 2. This lead frame 21 is used to manufacture an SHP type DRAM. The lead frame 21 is supported by connecting an island 11 to tie bars 7, 8 by two supporting leads 22, two first sub supporting leads 23 and two second sub supporting leads 24. The above supporting leads 22 are arranged on both sides of the island 11 in leftward and rightward directions in FIG. 1, i.e., on both sides in a parallel arranging direction of an outer lead portion 12b of a lead 12 for external connection. The supporting leads 22 are arranged between the tie bars 7 and 8. A connecting portion 22a extending in parallel with an end edge of the island 11 in its longitudinal direction is connected to the island 11 by connecting pieces 22b arranged at both ends of the connecting portion 22a.

The above connecting portion 22a is located below the tie bars 7, 8 and the lead 12 for external connection by folding an intermediate portion of each supporting lead 22. This folding portion is shown by reference numeral 22c. Similar to the supporting lead 22, another first sub supporting lead 23 and another second sub supporting lead 24 for supporting the island 11 are folded in their intermediate portions as shown in FIG. 2. Folding portions of these sub supporting leads 23, 24 are respectively designated by reference numerals 23a, 24a.

The above supporting lead 22 connects an electrode for a fixing potential such as an electrode for ground, etc. in the semiconductor chip 13 to a portion relatively higher than the above folding portion 22c on a side of the tie bar 7 by a bonding wire 14. The semiconductor chip 13 used in this embodiment is constructed such that a fixing potential is set on a rear face (a joining face to the island 11) of the semiconductor chip 13. Further, one basic end portion 22d of each supporting lead 22 connected to the tie bar 8 is formed in the same shape as the outer lead portion 12b of the lead 12 for external connection and is arranged outside a column of the outer lead portion 12b in the lead 12 for external connection. The basic end portion 22d has a structure in which this basic end portion 22d can be soldered to a wiring pattern for the fixing potential of an unillustrated printed wiring board.

Each first sub supporting lead 23 is arranged between the island 11 and the tie bar 8 such that the first sub supporting lead 23 is located within a lead group constructed by inner leads 12a of many leads 12 for external connection on one side and the other side from a center of the island 11. Each first sub supporting lead 23 connects the electrode for a fixing potential of the semiconductor chip 13 to a portion from the above folding portion 23a on a side of the tie bar 8 through the bonding wire 14. Further, a basic end portion 23b of the first sub supporting lead 23 connected to the tie bar 8 is formed in the same shape as each outer lead portion 12b of each lead 12 for external connection. Similar to the supporting lead 22, the basic end portion 23b can be soldered to a wiring pattern for the fixing potential of the printed wiring board.

Each second sub supporting lead 24 is arranged between the island 11 and the tie bar 8 and is located on a side opposed to the above first sub supporting lead 23 through a mounting portion of the semiconductor chip. No electrode for a fixing potential of the semiconductor chip 13 is connected to each second sub supporting lead 24.

In FIG. 1, a lead 25 for external connection arranged outside the above supporting lead 22 is connected to a second electrode for a fixing potential (e.g., an electrode for power) of the semiconductor chip 13 by the bonding wire 14. This lead 25 for external connection extends from one side of a package to the other side along an outside face of the above supporting lead 22.

In the lead frame 21 constructed in this way, the semiconductor chip 13 is mounted to the island 11 as shown in FIG. 1 and wire bonding is performed. Thereafter, similar to the conventional one, seal resin 2 is molded. A molding range of the seal resin 2 is shown by a two-dotted chain line in FIG. 1.

After the resin seal process is terminated, a forming portion of the semiconductor device is cut from the lead frame 21. At this time, the outer lead portion 12b of the lead 12 for external connection, the basic end portions 22d, 23b of the supporting lead 22 and the first sub supporting lead 23, and the pins 4 for support are projected from the seal resin 2 to its side. Thereafter, these leads are bent and are molded as shown in FIG. 3 such that end tip portions of these leads are one-sided below a through portion of the seal resin. Thus, the semiconductor device in the present invention can be manufactured.

In the semiconductor device formed in this way, the outer lead portion 12b of the lead 12 for external connection is soldered to a wiring pattern for a signal of the printed wiring board. Further, the basic end portions 22d, 23b of the supporting lead 22 and the first sub supporting lead 23 are soldered to the wiring pattern for a fixing potential of the printed wiring board. The pins 4 for support are soldered to a land for supporting the printed wiring board such that this semiconductor device is approximately parallel to the printed wiring board in a mounting state.

Accordingly, in this semiconductor device, the electrode for a fixing potential of the semiconductor chip 13 is connected to the two supporting leads 22, 22 for supporting both sides of the island 11, and the basic end portion 22d of each of these supporting leads 22 is soldered to the wiring pattern for a fixing potential of the printed wiring board. Accordingly, each of the supporting leads 22 can also function as a lead for a fixing potential. Therefore, the number of leads each used as only a lead for a fixing potential can be reduced and a space for forming the lead 12 for external connection can be widened. In particular, since the supporting leads 22 are formed on both the sides of the island 11, the above space is not divided by these supporting leads 22. As a result, the inner lead 12a of the lead 12 for external connection can be formed such that parasitic impedance is reduced.

Heat caused by the semiconductor chip 13 at its operating time is conducted to the wiring pattern for a fixing potential on the printed wiring board through the supporting leads 22 from both the ends of the island 11 and is radiated in a wide range of the printed wiring board. Accordingly, no thermal distribution of the semiconductor chip 13 is one-sided and a heat radiating property can be improved.

Further, since both the sides of the island 11 are supported by the supporting leads 22, the island 11 can be supported by the supporting leads 22 in well balance. Further, the supporting leads 22 are arranged between both the tie bars 7 and 8 and extend from one side portion of a package to another side portion thereof so that both ends of the island 11 are supported in the resin seal process. Namely, in the resin seal process, the island 11 can be strongly supported in well balance.

In addition to this, this semiconductor device has the first sub supporting lead 23 arranged within a lead group constructed by the inner lead portions 12a of the leads 12 for external connection such that this first sub supporting lead 23 is connected to the electrode for a fixing potential of the semiconductor chip 13 and is soldered to the wiring pattern for a fixing potential of the printed wiring board. Therefore, the number of heat radiating points can be increased by the first sub supporting lead 23 also used as a lead for a fixing potential so that the heat radiating property can be further improved. Further, when the first sub supporting lead 23 is arranged in this way, the second sub supporting lead 24 is arranged on an opposite side so that no support of the island 11 is unbalanced. In this embodiment, the lead frame for manufacturing the SHP type DRAM is explained, but the present invention can be also applied to a semiconductor device using a mounting mode in which a surface vertical package (SVP) is perpendicular to a mounting face of the printed wiring board. Further, the present invention can be also applied to a semiconductor device different from a high speed DRAM such as Rambus and synchronous, etc.

In the embodiment shown in FIG. 1, the electrode for a fixing potential of the semiconductor chip 13 is connected to the supporting leads 22, but the supporting leads 22 may be used for only heat radiation instead of this connection. When this construction is adopted, it is desirable to solder the supporting leads 22 to a wiring pattern for heat radiation extending on the printed wiring board.

What is claimed is:

1. A semiconductor device comprising:
    a semiconductor chip having fixing potential electrodes; and
    a lead frame for supporting said semiconductor chip, said lead frame having
        an island for mounting said semiconductor chip;
        leads for external connection of said semiconductor chip, having inner lead portions connected to said semiconductor chip through bonding wires and outer lead portions connected to said inner lead portions, respectively, and provided at one side portion of said island so as to be connected each other and arranged at a column parallel to said one side of said island;
        supporting leads for supporting said island at both sides of said island, said supporting leads being arranged on both sides of said island such that one end of each of said supporting leads supports said outer lead portions at both ends of said column of said outer lead portions; and
        bonding wires for connecting said fixing potential electrodes of said semiconductor chip and supporting leads.

2. The semiconductor device according to claim 1 comprising;
    a tie bar arranged at said one side portion of said island and supports each of said outer lead portions commonly;
    a first sub supporting lead arranged within a group of said inner lead portions such that one end of the first sub supporting lead is connected to said island and the other end of the first sub supporting lead is supported by said tie bar;
    bonding wires for connecting said fixing potential electrodes of said semiconductor chip and said first sub supporting lead; and
    a second sub supporting lead arranged on the other side of said island opposed to this first sub supporting lead.

3. A semiconductor device comprising;
    a semiconductor chip: and
    a lead frame for supporting said semiconductor chip, said lead frame having
        an island for mounting said semiconductor chip;
        supporting leads for supporting said island;
        leads for external connection of said semiconductor chip, having inner lead portions connected to the semiconductor chip through bonding wires and provided at one side portion of said island so as to be connected each other and arranged at a column parallel to said on side of said island; and
        supporting leads for supporting said island at both sides of said island, said supporting leads being arranged on both sides of said island such that one end of each of said supporting leads supports said outer lead portions at both ends of said column of said outer lead portions, said supporting leads being operated as heat radiation of said semiconductor chip.

4. The semiconductor device according to claim 3, wherein an electrode for a fixing potential of said semiconductor chip is connected to the supporting leads for heat radiation by the bonding wire, and one end of each of said supporting leads supports both ends of said column of said outer lead portions.

5. The semiconductor device according to claim 4, wherein the supporting leads for heat radiation are arranged inside said lead for external connection connected to a second electrode for a fixing potential of the semiconductor chip by the bonding wire.

* * * * *